(12) United States Patent  (10) Patent No.: US 9,046,762 B2
Kusuura  (45) Date of Patent: Jun. 2, 2015

(54) NANOIMPRINT LITHOGRAPHY

(75) Inventor: Takahisa Kusuura, Kawasaki (JP)

(73) Assignee: EMPIRE TECHNOLOGY DEVELOPMENT LLC, Wilmington, DE (US)

( * ) Notice: Subject to any disclaimer, the term of this patent is extended or adjusted under 35 U.S.C. 154(b) by 1193 days.

(21) Appl. No.: 12/708,054

(22) Filed: Feb. 18, 2010

(65) Prior Publication Data

US 2011/0200761 A1  Aug. 18, 2011

(51) Int. Cl.
*B29C 33/60* (2006.01)
*G03F 7/00* (2006.01)
*B82Y 10/00* (2011.01)
*B82Y 40/00* (2011.01)

(52) U.S. Cl.
CPC .............. *G03F 7/0002* (2013.01); *B82Y 10/00* (2013.01); *B82Y 40/00* (2013.01)

(58) Field of Classification Search
CPC ..... Y10S 977/887; B29C 33/44; B29C 59/16; B29C 33/56; B29C 33/60; B29C 35/0888; B29C 59/02; B29C 33/58
USPC ........................................................ 425/385
See application file for complete search history.

(56) References Cited

U.S. PATENT DOCUMENTS

| 5,436,083 A | 7/1995 | Haluska et al. |
| 2007/0267764 A1 | 11/2007 | Morimoto |
| 2009/0035701 A1 | 2/2009 | Liau et al. |
| 2009/0123590 A1 | 5/2009 | Komoriya et al. |
| 2010/0044921 A1 | 2/2010 | Ito |
| 2010/0109205 A1 | 5/2010 | Fletcher et al. |

FOREIGN PATENT DOCUMENTS

| JP | 2004-304097 | 10/2004 |
| JP | 2005-327788 | 11/2005 |
| JP | 2007-144995 | 6/2007 |
| JP | 2007-220797 | 8/2007 |
| JP | 2008-217845 | 9/2008 |
| JP | 2008-221491 | 9/2008 |
| WO | WO 2005/077549 | 8/2005 |
| WO | WO-2007/018218 | 2/2007 |
| WO | WO 2007/029176 | 3/2007 |

OTHER PUBLICATIONS

Gao, B., et al., Great Enhancement of Photocatalytic Activity of Nitrogen-Doped Titania by Coupling with Tungsten Oxide, J. Phys. Chem. B, vol. 110 (2006), pp. 14391-14397.*
Irie, H., et al., Interfacial structure dependence of layered TiO2/WO3 thin films on the photoinduced hydrophilic property. Vacuum, vol. 74 (2004), pp. 625-629.*
Zhang, Z., et al., Preparation of photocatalytic nano-ZnO/TiO2 film and application for determination of chemical oxygen demand, Talanta, vol. 73 (2007), pp. 523-528.*

(Continued)

*Primary Examiner* — Matthew Daniels
(74) *Attorney, Agent, or Firm* — Foley & Lardner LLP

(57) ABSTRACT

A molding system includes a mold having a base and at least one protuberance extending from the base. The protuberance has an end surface. The system also includes a first photo-catalyst layer on the end surface. The first photo-catalyst layer is configured to at least partially break down a residual layer on a substrate in response to activation of the first photo-catalyst layer by a first radiation.

8 Claims, 4 Drawing Sheets

(56) References Cited

OTHER PUBLICATIONS

Fukuhara, M., et al., "UV Nanoimprint Lithography and Its Application for Nanodevices," Jour. of Photopolymer Sci. and Tech., vol. 20, No. 4, 2007, 6 pages.
Liu, R., et al., "Optical Nanostructures Fabricated by SU-8 based Nanoimprint Lithography," Jour. Korean Phys. Soc., vol. 55, No. 3, Sep. 2009, pp. 1290-1294.
Molecular Imprints, Inc., "Whole Wafer Lithography System," Specification for IMPRIO 1100, 2009, 2 pages.
Nakamatsu, K. et al., "Bilayer Resist Method for Room-Temperature Nanoimprint Lithography," Japanese Jour. of Appl. Phy., vol. 43, No. 6B, pp. 4050-4053.
International Preliminary Report on Patentability for Intl. Pat. Appln. No. PCT/US2010/041190, mailed on Aug. 30, 2012, 10 pp.
"Breakthrough in Nanoimprinting Yields Simple Way to Make Microscopic Electronics," updated on Jul. 22, 2004, accessed at http://www.physorg.com/news461.html., 8 pp.
"LED lighting market to reach $1 billion in 2011," *LEDs Magazine*, updated Feb. 2, 2007, accessed at http://www.ledsmagazine.com/news/4/2/11.html, 1 page.
Liau, L. C.K. et al., "Photocatalytic Lithography Processing via Poly(vinyl butyral)/$TiO_2$ Photoresists by Ultraviolet (UV)Exposure," *Ind. Eng. Chem. Res.*, 2008, vol. 47, No. 7, pp. 2273-2278.
Chou, S. Y., et al., "Nanoimprint Lithography," *Journal of Vacuum Science & Technology B: Microelectronics and Nanometer Structures*, Nov. 1996, vol. 14, No. 6, pp. 4129-4133.
International Search Report and Written Opinion for PCT/US2010/041190 mailed Sep. 14, 2010.
"Spin Coat Theory," available at http://www.clean.cise.columbia.edu/process/spintheory.pdf, (2000). (6 pages).
EE Times, "IMS predicts solid growth for backlighting LED market," Aug. 16, 2007, available at http://www.eetimes.com/document.asp?doc_id=1305808. (2 pages).
Kim, et al., "Fabrication of photonic crystal structures on light emitting diodes by nanoimprint lithography," Nanotechnology 18 (2007). (5 pages).

\* cited by examiner

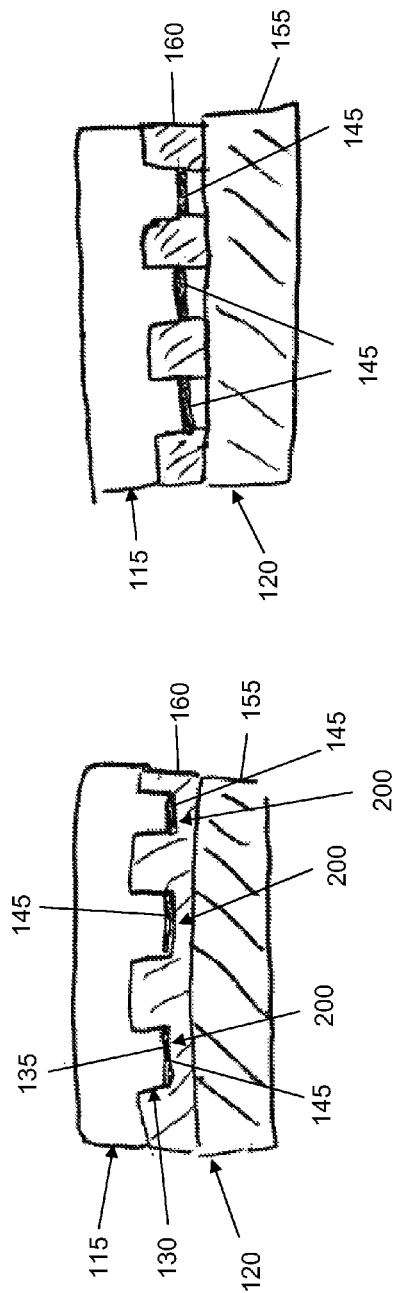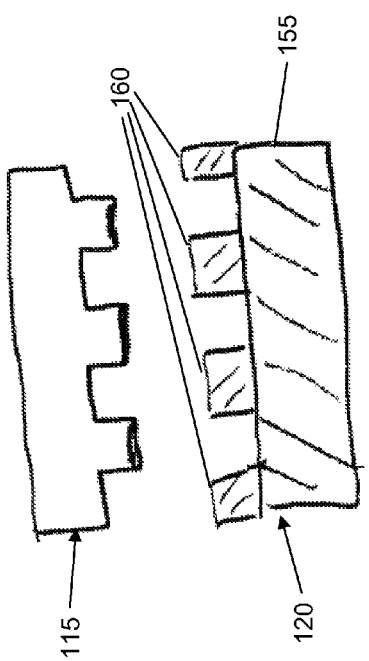

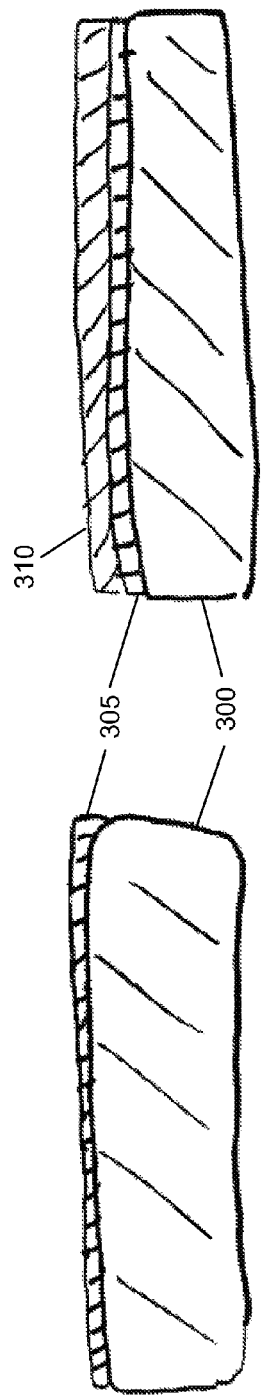
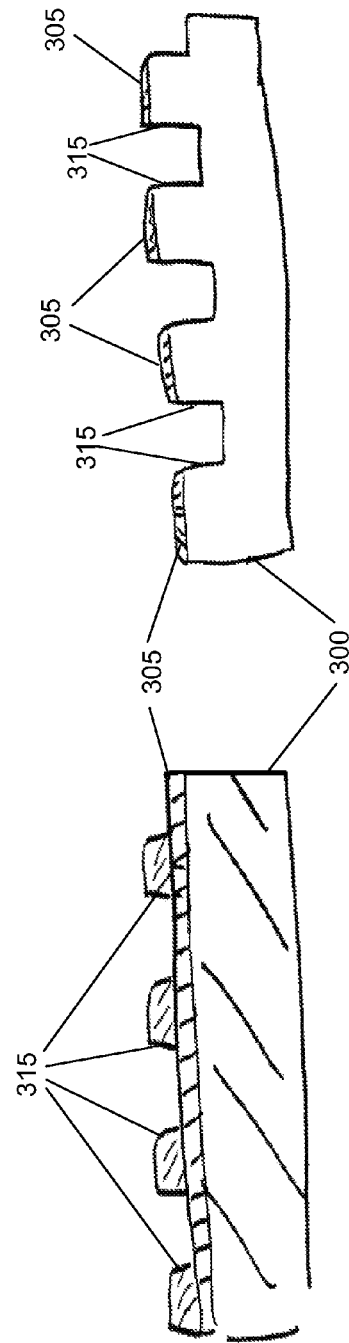

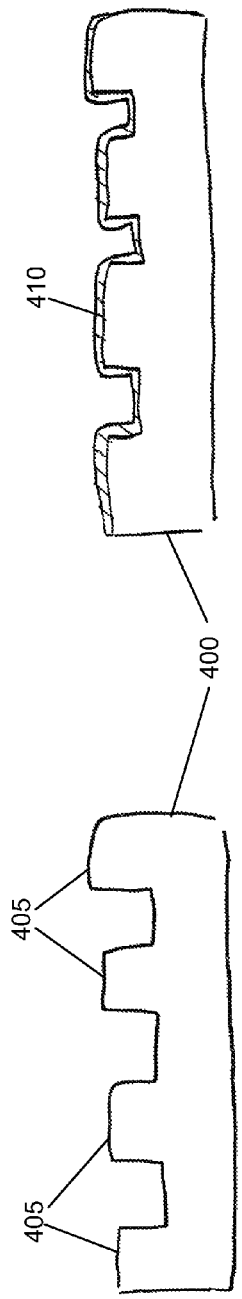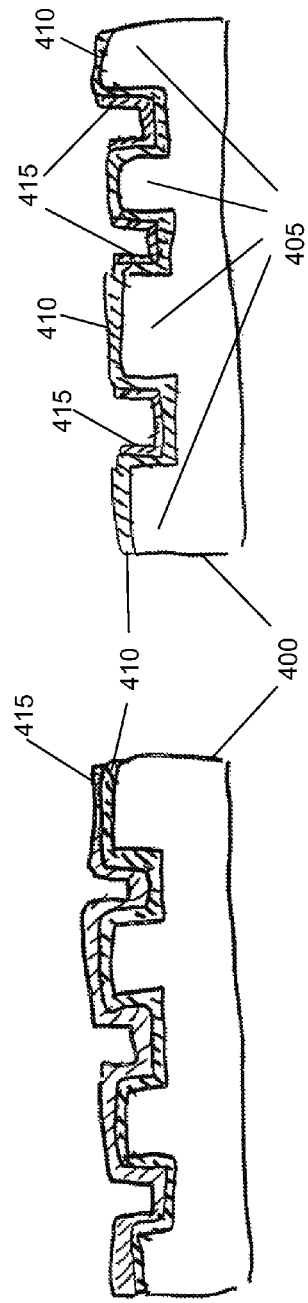
Fig. 4A
Fig. 4B
Fig. 4C
Fig. 4D

NANOIMPRINT LITHOGRAPHY

BACKGROUND

The following description is provided to assist the understanding of the reader. None of the information provided or references cited is admitted to be prior art.

Nanoimprinting can generally refer to a process for forming a nanometer scale pattern on a substrate. A mold having one or more protuberances that form the pattern is pressed onto a resist (or resin) layer of the substrate at a predetermined pressure. In a thermal nanoimprint process, heat is applied to the resist layer to help form the pattern. In an optical (or radiation) nanoimprint process, radiation of a predetermined wavelength is applied to the resist layer to help form the pattern. After the pattern is formed, the mold is removed from the substrate and etching is performed as known to those of skill in the art. However, prior to etching the substrate, a residual layer is removed from the substrate.

The residual layer is comprised of portions of the resist layer that remain on the substrate at points of contact between the ends of the one or more protuberances that form the pattern and the substrate. If the residual layer is not removed, etching defects may occur during the etching process. Traditional nanoimprint processes remove the residual layer through a reactive ion etching process or through an ashing process that involves application of oxygen ($O_2$) gas to the residual layer.

SUMMARY

An illustrative molding system includes a mold having a base and at least one protuberance extending from the base. The protuberance has an end surface. The system also includes a first photo-catalyst layer on the end surface. The first photo-catalyst layer is configured to at least partially break down a residual layer on a substrate in response to activation of the first photo-catalyst layer by a first radiation.

An illustrative molding method includes contacting a substrate with a mold to form a pattern on the substrate. The mold includes a base, a protuberance extending from the base, and a first photo-catalyst layer on an end surface of the protuberance. The first photo-catalyst layer is activated to break down a residual layer on the substrate.

Another illustrative molding method includes applying a first photo-catalyst layer to a first substrate. The first photo-catalyst layer is configured to react with a resist layer in response to activation of the first photo-catalyst layer by first radiation. A pattern is formed into the first substrate so that the first substrate comprises a base and a protuberance extending from the base, where the first photo-catalyst layer remains on an end surface of the protuberance.

The foregoing summary is illustrative only and is not intended to be in any way limiting. In addition to the illustrative aspects, embodiments, and features described above, further aspects, embodiments, and features will become apparent by reference to the following drawings and the detailed description.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several embodiments in accordance with the disclosure and are, therefore, not to be considered limiting of its scope, the disclosure will be described with additional specificity and detail through use of the accompanying drawings.

FIGS. 2A-2C are partial views of the nanoimprint lithography system of FIG. 1 that depict a molding process in accordance with an illustrative embodiment.

FIGS. 3A-3D depict stages of formation of a mold with a photo-catalyst layer in accordance with an illustrative embodiment.

FIGS. 4A-4D depict stages of formation of a mold with two photo-catalyst layers in accordance with an illustrative embodiment.

DETAILED DESCRIPTION

Figure 1:
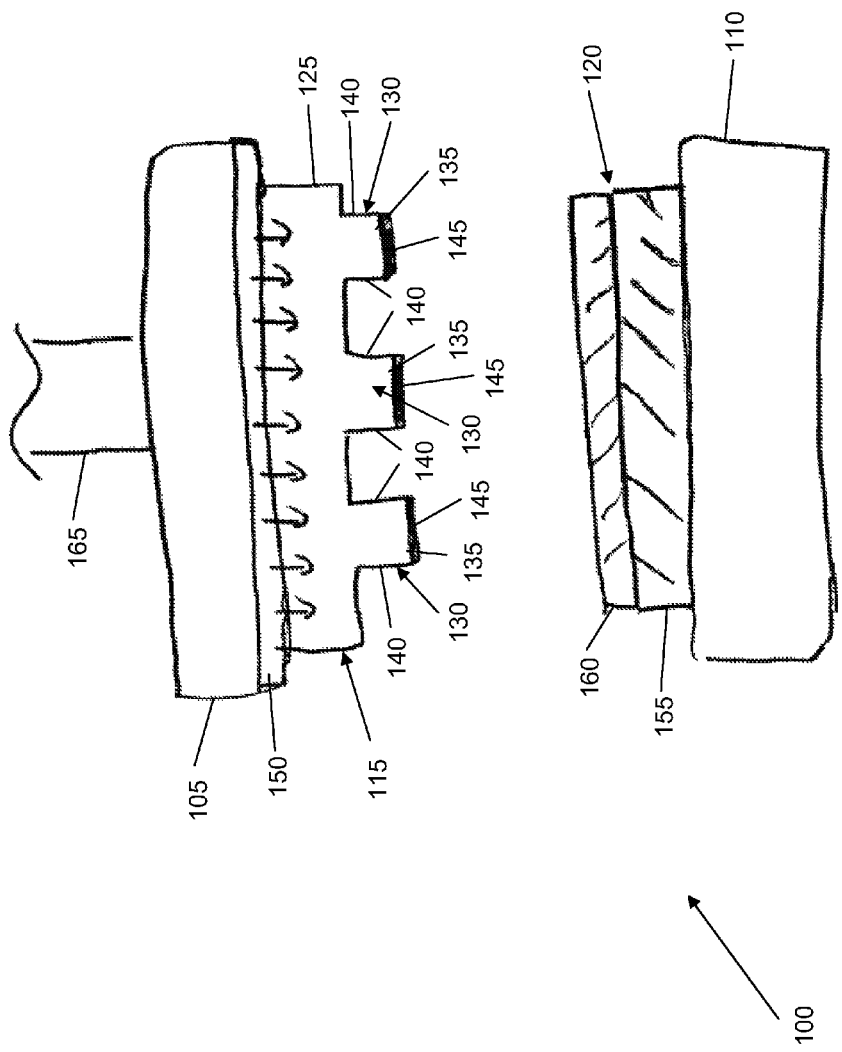
FIG. 1 depicts a nanoimprint lithography system in accordance with an illustrative embodiment.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and make part of this disclosure.

There are a variety of issues associated with traditional processes for removing the residual layer from a patterned substrate. These include, but are not limited to, removing portions of the resist layer that are intended to be part of the pattern, not completely removing portions of the residual layer, as well as other adverse impacts on the pattern. In addition, some characteristics of the processes may be suboptimal in terms of cost, difficulty, time, labor, and energy, among others. Described herein are systems for imprinting a pattern onto a resist layer of a substrate and for removing any residual layer from the substrate. As such, in an illustrative embodiment, the resist layer that forms the pattern is not removed during removal of the residual layer using the methods and systems described herein. In illustrative embodiments, a small portion (e.g., 0.5%, 1%, 2%, etc.) of the residual layer may still be removed during removal of the residual layer. Also described herein are mold formation processes.

The substrate to be molded can be made from one or more of silicon, gallium nitride (GaN), sapphire ($Al_2O_3$), glass, quartz, resins such as acrylic, polyethylene terephthalate (PET), cyclo-olefine, poly-carbonate, etc., and metals such as nickel and iron, among other appropriate substances. The resist layer, which is applied to the substrate as a thin film according to methods known to those of skill in the art, can be made from one or more of polymethylmethacrylate (PMMA), polymethylglutarimide (PMGI), diazonaphthoquinone (DNQ), phenol formaldehyde resist such as novolac, an epoxy-based polymer such as SU-8, among other appropriate substances. In an illustrative embodiment, the resist layer can be applied using a spin coating process as described in an anonymous article titled "Spin Coat Theory" available at the Columbia.edu website, the entire disclosure of which is incorporated by reference herein.

An illustrative nanoimprint lithography system (or system) includes a mold having a base and one or more protuberances extending from the base, where each protuberance has an end surface. The base and the one or more protuberances can be made from a radiation transmissive substance such as, but not limited to, quartz, sapphire, glass, inorganic polymers having silicon (Si) in a main chain (such as polysilazanes), etc. Illustrative polysilazanes are described in U.S. Pat. No. 5,436,083 to Haluska et al., the entire disclosure of which is incorporated by reference herein.

The number of protuberances, the dimensions of the protuberances, the shape of the protuberances, and the spacing between the protuberances can be determined as known to those of skill in the art based on the application for which the above-referenced substrate is being molded. An illustrative configuration can be as described in an article titled "UV Nanoimprint Lithography and Its Application for Nanodevices" by Fukuhara et al. from Volume 20, number 4 (2007) of the Journal of Photopolymer Science and Technology, the entire disclosure of which is incorporated herein by reference. The one or more protuberances form the pattern that is to be imprinted into the resist layer of the substrate during a molding process as known to those of skill in the art. An illustrative molding process is described in article titled "Nanoimprint lithography" by Chou et al., the entire disclosure of which is incorporated by reference herein.

As indicated above, a residual layer often remains on the substrate as a result of the molding process. The residual layer can refer to one or more portions of the resist layer that undesirably remain on the substrate in between the end surface(s) of the one or more protuberances of the mold and the substrate. An illustrative residual layer is illustrated with reference to FIG. 2A.

In an illustrative embodiment, the end surface(s) of the one or more protuberances have a first photo-catalyst layer applied thereon. The first photo-catalyst layer can be applied as a liquid using a spin-coating process, as a thin film using a spattering process, as a dry film, or by other methods known to those of skill in the art. The first photo-catalyst layer can include, but is not limited to, one or more of titanium oxide, silicon oxide, zinc oxide, ferric oxide, tungsten oxide, gallium phosphide, gallium arsenide, cadmium sulfide, or strontium titanate. Upon activation by radiation, the first photo-catalyst layer is configured to react with and break down the residual layer that remains on the substrate. In an illustrative embodiment, the reaction is an oxidation reduction reaction as described in more detail below with reference to the figures. The first photo-catalyst layer can be activated during and/or after the molding process, depending on the embodiment. In an illustrative embodiment, the radiation used to activate the first photo-catalyst layer can have a wavelength of less than approximately 400 nm. Alternatively, other wavelengths such as less than approximately 500 nm, less than approximately 900 nm, etc. may be used. As used herein, the term approximately can refer to within 1-2 nm, within 1-10 nm, within 1-20 nm, etc. As an example, the wavelength used to activate a titanium oxide photo-catalyst can be less than approximately 388 nm, the wavelength used to activate a tungsten oxide photo-catalyst can be less than approximately 460 nm, the wavelength used to activate a strontium titanate photo-catalyst can be less than approximately 600 nm, and the wavelength used to activate a photo-catalyst formed from a mixture of zinc oxide and gallium nitride can be less than approximately 500 nm.

In one embodiment, a second photo-catalyst layer is also applied onto at least a portion of the base of the mold and at least a portion of the one or more protuberances. The second photo-catalyst layer can be applied as a liquid using a spin-coating process, as a thin film using a spattering process, as a dry film, or by other methods known to those of skill in the art.

In an illustrative embodiment, the second photo-catalyst layer covers at least a portion of the base of the mold and at least a portion of the one or more protuberances, but does not cover the end surface(s) of the one or more protuberances. Upon activation by radiation, the second photo-catalyst layer is configured to break and/or loosen, through a chemical reaction, a bond between the mold and the substrate (or the resist layer on the substrate) that forms during the molding process. The chemical reaction can be an oxidation reduction reaction as described in more detail below. As such, the second photo-catalyst layer helps to facilitate release of the mold from the substrate after the molding process with little or no damage to the mold or to the substrate (i.e., because any bond between the mold and the substrate has been broken). The second photo-catalyst layer can include one or more of titanium oxide, nitrogen doped titanium oxide, silicon oxide, zinc oxide, ferric oxide, tungsten oxide, gallium phosphide, gallium arsenide, cadmium sulfide, strontium titanate, etc.

In an illustrative embodiment, a first wavelength of first radiation to activate the first photo-catalyst layer is greater (i.e., longer) than a second wavelength of second radiation to activate the second photo-catalyst layer. In one embodiment, the first radiation and the second radiation can be different types of light such as ultraviolet (UV) and visible light. Alternatively, the first radiation and the second radiation can both be the same type of light (i.e., ultraviolet, etc.) and can have different wavelengths within that same type of light. In one embodiment, the first wavelength and the second wavelength can differ from one another by at least approximately 50 nm. Alternatively, the first and second wavelengths may differ from one another by at least approximately 40 nm, at least approximately 100 nm, at least approximately 200 nm, etc. The first radiation and/or the second radiation can be applied for a relatively short amount of time (i.e., several seconds) due to a high decomposition efficiency of the photo-catalyst. The decomposition efficiency, which can refer to the efficiency with which the photo-catalyst is able to decompose a reactant, can be high due in part to the small area upon which the photo-catalyst layer is applied and the small area at which the reaction occurs. The time of application can be between approximately 30 seconds and 75 seconds, between approximately 25 seconds and 80 seconds, between approximately 20 seconds and 90 seconds, between approximately 10 seconds and 100 seconds, etc. The intensity of the radiation used can be approximately 1.2 milli-Watts per square centimeter (mW/cm$^2$). The intensity of the radiation may also be between approximately 1 mW/cm$^2$ and 10 mW/cm$^2$, between approximately 0.9 mW/cm$^2$ and 12 mW/cm$^2$, between approximately 0.8 mW/cm$^2$ and 14 mW/cm$^2$, etc.

The system can also include a first stage configured to hold the mold and a second stage configured to hold the substrate. In an illustrative embodiment, the first stage is positioned above the second stage. Alternatively, the first stage may be positioned below the second stage. In another alternative embodiment, the first stage and the second stage may be positioned side-by-side or in another suitable configuration. The first stage can move relative to the second stage, the second stage can move relative to the first stage, or both the first and second stages can move relative to one another. The first and second stages can be made from material(s) and can have shapes, dimensions, etc. as known to those of skill in the art. Illustrative first and second stages are described in U.S. Patent Application Publication No. 2009/0123590 to Komoriya et al., the entire disclosure of which is incorporated by reference herein. Additional illustrative stages are described in an article titled "IMPRIO 1100 Whole Wafer Lithography System" by Molecular Imprints, Inc., the entire disclosure of which is incorporated by reference herein.

The system can further include a radiation source configured to apply the first radiation to the first photo-catalyst layer and/or the second radiation to the second photo-catalyst layer. The radiation source can be mounted to the first stage such that radiation emitted from the radiation source travels through the mold (which may be radiation transmissive) to activate the first and/or second photo-catalyst layers. Alternatively, the radiation source may be a separate component that is not mounted to the first stage, or the radiation source may be mounted to the second stage. As described in more detail below, the type of radiation source used can depend at least in part on the wavelength of the radiation to be generated. Illustrative radiation sources can include a semiconductor laser, a high pressure mercury lamp, a metal halide lamp, a krypton fluoride (KrF) excimer laser, an argon fluoride (ArF) excimer laser, a fluoride ($F_2$) excimer laser, an extreme ultraviolet (UV) lamp, an electron beam, etc.

As an example, the first photo-catalyst layer can be nitrogen doped titanium oxide and can be activated by first radiation having a wavelength of approximately 500 nm. The second photo-catalyst layer can be titanium oxide and can be activated by second radiation having a wavelength of approximately 360 nm. The first radiation of 500 nm activates the first photo-catalyst layer, but not the second photo-catalyst layer because titanium oxide is only activated by radiation having a wavelength that is less than approximately 388 nm. The second radiation activates both the first and second photo-catalyst layers because the nitrogen doped titanium oxide is activated by any radiation having a wavelength that is less than approximately 520 nm. The radiation source, which can be a high pressure mercury lamp, can be configured to generate the first radiation to activate the first photo-catalyst layer for removal of the residual layer. The radiation source can further be configured to generate the second radiation to activate the second photo-catalyst layer for breaking and/or loosening a bond between the mold and the substrate. The radiation source is described in more detail below with reference to the figures.

FIG. 1 depicts a nanoimprint lithography system 100 in accordance with an illustrative embodiment. Nanoimprint lithography system (or system) 100 optionally includes a first stage 105 and optionally a second stage 110. First stage 105, which is configured to secure a mold 115 by any method known to those of skill in the art, can have a shape and size as known to those of skill in the art. First stage 105 can also be made from materials known to those of skill in the art. As an example, first stage 105 can be made from quartz, glass, sapphire, etc. Second stage 110, which is configured to secure a substrate 120 by any method known to those of skill in the art, can similarly have a shape and size as known to those of skill in the art, and can be made from materials known to those of skill in the art. As an example, second stage 110 can be made from copper, steel, aluminum, etc. In an illustrative embodiment, mold 115 can be secured to first stage 115 and/or substrate 120 can be secured to second stage 110 using screws or other fasteners. In another illustrative embodiment, mold 115 can be secured to first stage 115 and/or substrate 120 can be secured to second stage 110 using an adhesive layer as described in U.S. Patent Application Publication No. 2009/0123590 to Komoriya et al., the entire disclosure of which is incorporated by reference herein. As illustrated in FIG. 1, first stage 105 is positioned above second stage 110. In an alternative embodiment, first stage 105 may be positioned below second stage 110. In another alternative embodiment, first stage 105 and second stage 110 may be positioned side-by-side or in another suitable configuration.

In an illustrative embodiment, mold 115 is made from a radiation transmissive substance such as quartz, sapphire, glass, inorganic polymers having silicon (Si) in a main chain, etc. Mold 115 includes a base 125 and a plurality of protuberances 130. Each of protuberances 130 includes an end surface 135 and sides 140. Protuberances 130 form a pattern that is to be formed on substrate 120. The number of protuberances 130, the dimensions of protuberances 130, the shape of protuberances 130, and the spacing between protuberances 130 can be determined as known to those of skill in the art based on the application for which substrate 120 is to be used. As an example, mold 115 can be used to form light emitting diodes and magnetic media. An illustrative configuration of mold 115 can be as described in an article titled "UV Nanoimprint Lithography and Its Application for Nanodevices" by Fukuhara et al. from Volume 20, number 4 (2007) of the Journal of Photopolymer Science and Technology, the entire disclosure of which is incorporated herein by reference. Illustrative applications include semiconductors and photonic crystal structures for use in light emitting diodes (LEDs), organic field effect transistors, magnetic media, metal-oxide-semiconductor field effect transistors, memory, polarizers, etc. For example, the processes described herein can be used to fabricate LEDs for use as backlights in liquid crystal display (LCD) televisions, LCD computer monitors, etc. Additional examples of applications can be found in an article titled "UV Nanoimprint Lithography and Its Application for Nanodevices" by Fukuhara et al. from the Journal of Photopolymer Science and Technology (Vol. 20, No. 4 (2007) 499-503), the entire disclosure of which is incorporated by reference herein.

Mold 115 also includes a photo-catalyst layer 145 applied to at least a portion of end surfaces 135 of protuberances 130. Illustrative methods for applying photo-catalyst layer 145 to mold 115 are described in detail with reference to FIGS. 3-4. Photo-catalyst layer 145 can be titanium oxide ($TiO_2$), silicon oxide ($SiO_2$), zinc oxide (ZnO), ferric oxide ($Fe_2O_3$), tungsten oxide ($WO_3$), gallium phosphide (GaP), gallium arsenide (GaAs), cadmium sulfide (CdS), strontium titanate ($SrTiO_3$), etc. In an illustrative embodiment, photo-catalyst layer 145 is configured, upon activation by radiation, to break down any residual layer that remains on substrate 120 at the points of contact of end surfaces 135 of protuberances 130 with a resist layer 160 of substrate 120.

Photo-catalyst layer 145 can break down the residual layer through, for example, an oxidative decomposition reaction as known to those of skill in the art. In the oxidative decomposition reaction, photons from an applied radiation can activate (i.e., place into an excited state) a metal (or other reactive component) in photo-catalyst layer 145 as known to those of skill in the art. The excited metal can bond to the residual layer, thereby breaking an internal bond of the residual layer. Oxygen present in photo-catalyst layer 145 and/or present in the environment can also bond to the residual layer to further break down the residual layer and to prevent reformation of the internal bond of the residual layer. As an example, when photocatalyst titanium dioxide ($TiO_2$) absorbs radiation, it will produce pairs of electrons and holes. The electron of the valence band of the titanium dioxide becomes excited when illuminated by the radiation. The excess energy of this excited electron promotes the electron to the conduction band of titanium dioxide, thereby creating a negative-electron (e−) and positive-hole (h+) pair. This stage can be referred to as the semiconductor's photo-excitation state. The energy difference between the valence band and the conduction band is known as the Band Gap. The wavelength of radiation for photo-excitation can be determined based on the following equation: 1240 (Planck's constant, h)/3.2 ev (band gap energy in electron volts)=388 nm. The positive-hole of the titanium dioxide can break apart a formed water molecule to form hydrogen gas and a hydroxyl radical. The negative-electron can react with oxygen molecules to form a super oxide anion, which decomposes organic materials.

As such, the residual layer can be broken down into particles (such as $H_2O$ and $CO_2$) that are not bonded (or that are weakly bonded) to one another. The gaseous particles dissipate into the environment. Other particles can be readily removed from the substrate by washing, blowing, etc. An illustrative particle removal process is described in an article titled "Semiconductor Cleaning" available on the 3M website (3m.com), the entire disclosure of which is incorporated by reference herein. In another illustrative embodiment, photocatalyst layer 145 can be activated by radiation that has a wavelength of between approximately 10 nanometers (nm) and approximately 400 nm. Alternatively, other wavelength ranges such as approximately 8 nm-500 nm, approximately 100 nm-900 nm, etc. may be used. The molding process performed by system 100 is described in more detail with reference to FIG. 2.

An optional radiation source 150 is used to generate the radiation to activate photo-catalyst layer 145. The amount of time that radiation is applied to activate photo-catalyst layer 145 can depend upon the composition of photo-catalyst layer 145, the thickness of photo-catalyst layer 145, the composition of resist layer 160, etc. In an illustrative embodiment, the radiation can be applied to photo-catalyst layer 145 for a relatively short amount of time because of a high decomposing efficiency of photo-catalyst layer 145. The decomposing efficiency can be high due at least in part to the small area upon which photo-catalyst layer 145 is applied. The time of application of the radiation can be between approximately 30 seconds and 75 seconds, between approximately 20 seconds and 90 seconds, between approximately 10 seconds and 100 seconds, etc.

As illustrated with reference to FIG. 1, radiation source 150 is optionally mounted to first stage 105. As such, radiation from radiation source 150 can travel through mold 115 (which can be made from a radiation transmissive material) to activate photo-catalyst layer 145 during or after the molding process. The radiation generated by radiation source 150 is represented by arrows extending from radiation source 150 toward photo-catalyst layer 145 in FIG. 1. In an alternative embodiment, radiation source 150 may be a separate component of system 100 that is not mounted to first stage 105.

The type of radiation source used in system 100 can be based at least in part on a radiation wavelength at which photo-catalyst layer 145 is activated and/or at least in part on the material from which resist layer 160 is composed. For example, radiation source 150 may be a semiconductor laser configured to generate radiation having a wavelength of 830 nanometers (nm), 532 nm, 488 nm, 405 nm, etc. Radiation source 150 can also be a high pressure mercury lamp configured to generate a g line wavelength of 436 nm, an h line wavelength of 405 nm, an i line wavelength of 365 nm, a wavelength having a mixture of g line, h line, and/or i line wavelengths, etc. Radiation source 150 can further be a metal halide lamp, a krypton fluoride (KrF) excimer laser configured to generate a wavelength of 248 nm, an argon fluoride (ArF) excimer laser configured to generate a wavelength of 193 nm, a fluoride ($F_2$) excimer laser configured to generate a wavelength of 157 nm, an extreme ultraviolet (UV) lamp configured to generate a wavelength of 13.6 nm, an electron beam, etc. In alternative embodiments, other types of radiation sources and/or wavelengths of radiation known to those of skill in the art may be used.

Substrate 120 includes a base 155 and resist (or photoresist) layer 160 applied to base 155. Base 155 can be made from silicon, gallium nitride (GaN), sapphire ($Al_2O_3$), glass, quartz, resins such as acrylic, polyethylene terephthalate (PET), cyclo-olefine, poly-carbonate, etc., and metals such as nickel, iron, etc. Resist layer 160 can include one or more of polymethylmethacrylate (PMMA), polymethylglutarimide (PMGI), diazonaphthoquinone (DNQ), phenol formaldehyde resist such as novolac, an epoxy-based polymer such as SU-8, etc. Resist layer 160 can be applied as a liquid using a spin-coating process, as a dry film, or by other methods known to those of skill in the art. In an illustrative embodiment, resist layer 160 is configured to be contacted by mold 115 so that the pattern formed by protuberances 130 is imprinted into resist layer 160.

First stage 105 is optionally mounted to a press 165 that is configured to place mold 115 into contact with substrate 120. Press 165 is also configured to apply a predetermined pressure to first stage 105 so that mold 115 contacts substrate 120 with the predetermined pressure. Press 165 can be a hydraulic press, servo press, or other type of press known to those of skill in the art. Illustrative presses are described an article titled "Bilayer Resist Method for Room-Temperature Nanoimprint Lithography" by Nakamatsu et al. in the Japanese Journal of Applied Physics (43 (2004) pp. 4050-4053), the entire disclosure of which is incorporated by reference herein. Illustrative presses are also described in International Patent Publication No. WO 2007/018218 to Narukawa et al., the entire disclosure of which is incorporated by reference herein. In one embodiment, in addition to the pressure applied by press 165, a heat source (not shown) may also be used to apply heat to resist layer 160 to help form the pattern into resist layer 160 as known to those of skill in the art. In an illustrative embodiment, the heat source can be an all-in-one ceramic type heater. In such an embodiment, the heat applied to resist layer 160 can be between approximately 100 degrees Celsius (° C.) and 200° C., depending on the material(s) from which resist layer 160 is made. Alternatively, the heat applied to resist layer 160 may be between approximately 90° C.-210° C., between approximately 80° C.-250° C., etc. As an example, resist layer 160 can be SU-8 having a thickness of 100 nm and the temperature can be between approximately 95° C.-100° C. Other illustrative thicknesses of resist layer 160 can be 500 nm, 2.5 micro-meters, etc. The heat can be applied for a predetermined amount of time based on the materials used for resist layer 160 and substrate 120 as known to those of skill in the art. In an illustrative embodiment, the heat can be applied for 30 minutes total. Heat application is described in more detail in an article titled "Optical Nanostructures Fabricated by SU-8 based Nanoimprint Lithography" by Liu et al. in the Journal of the Korean Physical Society (Vol. 55, No. 3, September 2009, pp. 1290-1294), the entire disclosure of which is incorporated by reference herein. In an embodiment in which heat is used, the pressure applied by press 165 can be between approximately 0.1 mega-Pascal (MPa) and 10 MPa. Alternatively, the pressure may be between approximately 0.08 MPa-12 MPa, between approximately 0.06 MPa-15 MPa, etc. The pressure can be applied for a predetermined amount of time based on the materials used for resist layer 160 and substrate 120 as known to those of skill in the art.

In an alternative embodiment, radiation may be applied to resist layer 160 to help form the pattern into resist layer 160 as known to those of skill in the art. The radiation to activate resist layer 160 can be applied by radiation source 150 or by a different radiation source, dependent on the embodiment. In an embodiment in which radiation is used to help form the pattern into resist layer 160, the wavelength of such radiation can be the same as or different from the wavelength of radiation that activates photo-catalyst layer 145, depending on the embodiment. In an embodiment in which the wavelengths are different, the use of radiation to form the pattern into resist layer 160 does not also activate photo-catalyst layer 145, and photo-catalyst layer 145 can be activated after the molding process. In an embodiment in which the wavelengths are the same, the radiation used to form the pattern into resist layer 160 can also activate photo-catalyst layer 145 such that the residual layer is broken down during the molding process. In an embodiment in which the wavelengths are different, the two wavelengths can be applied at distinct times or simultaneously. The radiation used to form the pattern in resist layer 160 can be applied for a predetermined amount of time based on the materials used for resist layer 160 and substrate 120 as known to those of skill in the art. In an embodiment in which radiation is used to form the pattern in resist layer 160, the pressure applied by press 165 can be between approximately 0.2 MPa and 1.2 MPa. Alternatively, the pressure may be between approximately 0.1 MPa-2 MPa, between approximately 0.05 MPa-5 MPa, etc. The pressure can be applied for a predetermined amount of time based on the materials used for resist layer 160 and substrate 120 as known to those of skill in the art.

FIGS. 2A-2C are partial views of nanoimprint lithography system 100 of FIG. 1 that depict a molding process in accordance with an illustrative embodiment. FIG. 2A depicts a residual layer 200 formed as a result of molding substrate 120 with mold 115 in accordance with an illustrative embodiment. Mold 115 can be applied to substrate 120 using a predetermined pressure that is based at least in part on the material(s) from which resist layer 160 is made. As described with reference to FIG. 1, the amount of pressure can also be based at least in part on whether heat and/or radiation is used to help imprint the pattern of mold 115 onto substrate 120. The pressure can be applied by press 165 described with reference to FIG. 1. If a thermal nanoimprinting process is used, heat can be applied as known to those of skill in the art to help mold the pattern formed by protuberances 130 of mold 115 onto resist layer 160. If an optical nanoimprinting process (i.e., ultraviolet (UV) or other radiation) is used, radiation can be applied as known to those of skill in the art to help mold the pattern formed by protuberances 130 of mold 115 onto resist layer 160.

In can be seen in FIG. 2A that residual layer 200 (of resist layer 160) remains between photo-catalyst layer 145 and base 155 of substrate 120. As described above, it is desirable to remove residual layer 200 prior to performing an etching process to etch the pattern formed on resist layer 160 into base 155 of substrate 120. FIG. 2B depicts substrate 120 with residual layer 200 broken down in accordance with an illustrative embodiment. Residual layer 200 is broken down by activating photo-catalyst layer 145 with radiation of a predetermined wavelength as described with reference to FIG. 1. Photo-catalyst layer 145 can be activated during or after molding of the pattern formed by protuberances 130 onto resist layer 160, depending on the embodiment. As a result of the activation, photo-catalyst layer 145 reacts with residual layer 200 to at least partially break down and/or decompose residual layer 200. In one embodiment, the reaction is an oxidative decomposition reaction. In an illustrative embodiment, mold 115 is made from a radiation transmissive material such that the radiation to activate photo-catalyst layer 145 travels through mold 115.

FIG. 2C depicts mold 115 removed from substrate 120 in accordance with an illustrative embodiment. Mold 115 can be removed from substrate 120 using press 165 described with reference to FIG. 1. As illustrated in FIG. 2C, residual layer 200 has been removed such that substrate 120 can be etched by any method known to those of skill in the art. FIG. 2C also illustrates that the pattern formed into resist layer 160 has not been significantly eroded or otherwise significantly adversely affected by the removal of residual layer 200.

FIGS. 3A-3D depict formation of a mold with a photo-catalyst layer in accordance with an illustrative embodiment. FIG. 3A depicts a substrate 300 with a photo-catalyst layer 305 applied thereon in accordance with an illustrative embodiment. Photo-catalyst layer 305 can be applied to substrate 300 as a thin film by any method known to those of skill in the art. In an illustrative embodiment, substrate 300 is a radiation transmissive material such as quartz, sapphire, glass, inorganic polymers having silicon (Si) in a main chain, etc. In another illustrative embodiment, photo-catalyst layer 305 can be made from one or more of titanium oxide ($TiO_2$), silicon oxide ($SiO_2$), zinc oxide (ZnO), ferric oxide ($Fe_2O_3$), tungsten oxide ($WO_3$), gallium phosphide (GaP), gallium arsenide (GaAs), cadmium sulfide (CdS), strontium titanate ($SrTiO_3$), etc.

The material(s) from which photo-catalyst layer 305 is made are selected such that photo-catalyst layer 305 will react with and break down a residual layer on a substrate to be molded (not shown) upon activation of photo-catalyst layer 305 by radiation. The radiation used to activate photo-catalyst layer 305 depends at least in part on the material(s) from which photo-catalyst layer 305 is made. In an illustrative embodiment, the radiation used to activate photo-catalyst layer 305 has a wavelength of between approximately 10 nm and 400 nm. Alternatively, other wavelength ranges such as approximately 8 nm-500 nm, approximately 100 nm-900 nm, etc. may be used.

FIG. 3B depicts a resist layer 310 applied over photo-catalyst layer 305 in accordance with an illustrative embodiment. Resist layer 310 can include one or more of polymethylmethacrylate (PMMA), polymethylglutarimide (PMGI), diazonaphthoquinone (DNQ), phenol formaldehyde resist such as novolac, an epoxy-based polymer such as SU-8, etc. Resist layer 310 can be applied as a liquid using a spin-coating process, as a dry film, or by other methods known to those of skill in the art.

FIG. 3C depicts a pattern formed into resist layer 310 in accordance with an illustrative embodiment. The pattern includes a plurality of protuberances 315. The number of protuberances 315, the dimensions of protuberances 315, the shape of protuberances 315, and the spacing between protuberances 315 can be determined as known to those of skill in the art based on the application for which the mold being formed is to be used. The pattern can be formed using a lithography process as known to those of skill in the art. Illustrative lithography processes include ion beam lithography, electron beam lithography, photolithography, etc.

FIG. 3D depicts a completed mold with photo-catalyst layer 305 on the end surfaces of protuberances 315 in accordance with an illustrative embodiment. The completed mold is formed by etching the pattern (illustrated in FIG. 3C) formed into resist layer 310 into substrate 300. The etching process can be performed as known to those of skill in the art. As a result of the etching, portions of photo-catalyst layer 305 in the valleys (i.e., the low points) of the pattern are removed and portions of photo-catalyst layer 305 at the peaks (i.e., the end surfaces of protuberances 315) remain. As such, the completed mold of FIG. 3D can be used to mold a substrate, and photo-catalyst layer 305, upon activation by radiation of the appropriate wavelength, can be used to remove any residual layer from the molded substrate.

FIGS. 4A-4D depict formation of a mold with two photo-catalyst layers in accordance with an illustrative embodiment. FIG. 4A depicts a substrate 400 having a plurality of protuberances 405 in accordance with an illustrative embodiment. In an illustrative embodiment, substrate 400 is a radiation transmissive material such as quartz, sapphire, glass, inorganic polymers having silicon (Si) in a main chain, etc. Protuberances 405 can be etched into substrate 400 according to any method known to those of skill in the art.

FIG. 4B depicts a first photo-catalyst layer 410 applied onto substrate 400 in accordance with an illustrative embodiment. First photo-catalyst layer 410 can be applied to substrate 400 as a thin film by any method known to those of skill in the art. In an illustrative embodiment, first photo-catalyst layer 410 can be made from one or more of titanium oxide ($TiO_2$), silicon oxide ($SiO_2$), zinc oxide (ZnO), ferric oxide ($Fe_2O_3$), tungsten oxide ($WO_3$), gallium phosphide (GaP), gallium arsenide (GaAs), cadmium sulfide (CdS), strontium titanate ($SrTiO_3$), etc.

The material(s) from which first photo-catalyst layer 410 is made are selected such that first photo-catalyst layer 410 will react with and break down a residual layer on a substrate to be molded (not shown) upon activation of first photo-catalyst layer 410 by radiation. The radiation used to activate first photo-catalyst layer 410 depends at least in part on the material(s) from which first photo-catalyst layer 410 is made. In an illustrative embodiment, the radiation used to activate first photo-catalyst layer 410 has a wavelength of between approximately 10 nm and 400 nm. Alternatively, other wavelength ranges such as approximately 8 nm-500 nm, approximately 100 nm-900 nm, etc. may be used.

FIG. 4C depicts a second photo-catalyst layer 415 applied onto first photo-catalyst layer 410 in accordance with an illustrative embodiment. Second photo-catalyst layer 415 can be applied onto first photo-catalyst layer 410 as a thin film by any method known to those of skill in the art. In an illustrative embodiment, the material(s) from which second photo-catalyst layer 415 is made are selected such that second photo-catalyst layer 415 will react with a resist layer on a substrate to be molded (not shown) to help loosen and/or break bonds between substrate 400 and the resist layer on the substrate to be molded. Such bonds may be formed during the molding process as known to those of skill in the art. Activation of second photo-catalyst layer 415 may also loosen and/or break bonds that form between second photo-catalyst layer 415 and the resist layer on the substrate to be molded. As such, the mold formed by substrate 400 can be removed from the molded substrate without damaging the mold or the molded substrate.

The material(s) from which second photo-catalyst layer 415 is made are further selected based on the material(s) from which first photo-catalyst layer 410 is made. In an illustrative embodiment, first photo-catalyst layer 410 and second photo-catalyst layer 415 are not activated by radiation of the same or similar wavelength. As such, first photo-catalyst layer 410 can be activated prior to second photo-catalyst layer 415, and the radiation used to activate second photo-catalyst layer 415 can activate both first photo-catalyst layer 410 and second photo-catalyst layer 415. In another illustrative embodiment, a first wavelength of first radiation used to activate first photo-catalyst layer 410 is greater than a second wavelength of second radiation used to activate second photo-catalyst layer 415. In one embodiment, the first radiation and the second radiation can be different types of light such as ultraviolet (UV) and visible light. Alternatively, the first radiation and the second radiation can both be the same type of light (i.e., ultraviolet, etc.) and can have different wavelengths within that same type of light. In an illustrative embodiment, the first wavelength and the second wavelength can differ from one another by approximately at least 50 nm. Alternatively, the first and second wavelengths may differ from one another by approximately at least 40 nm, approximately at least 100 nm, approximately at least 200 nm, etc. In one embodiment, first photo-catalyst layer 410 can be titanium oxide and second photo-catalyst layer 415 can be tungsten oxide. In another embodiment, first photo-catalyst layer 410 can be titanium oxide and second photo-catalyst layer 415 can be nitrogen doped titanium oxide. In alternative embodiments, other material(s) may be used for first photo-catalyst layer 410 and/or second photo-catalyst layer 415.

FIG. 4D depicts a completed mold having first photo-catalyst layer 410 on the end surfaces of protuberances 405 in accordance with an illustrative embodiment. As illustrated in FIG. 4D, portions of second photo-catalyst layer 415 on the end surfaces of protuberances 405 have been removed. In an illustrative embodiment, the portions of second photo-catalyst layer 410 are removed using a chemical polishing process as known to those of skill in the art.

As further illustrated in FIG. 4D, portions of second photo-catalyst layer 415 remain on the sides of protuberances 405 and on the bottoms of the valleys in between protuberances 405. As such, activation of first photo-catalyst layer 410 causes a reaction between first photo-catalyst layer 410 and the residual layer on a molded substrate only at the points of contact of the end surfaces of protuberances 405 with the residual layer. Portions of first photo-catalyst layer 410 that are on the sides of protuberances 405 and on the bottoms of the valleys in between protuberances 405 do not react with or break down the molded resist layer (on a substrate being molded) because those portions of first photo-catalyst layer 410 are covered by second photo-catalyst layer 415. After the substrate is molded with the completed mold and the first photo-catalyst layer 410 is activated to break down any residual layer, second photo-catalyst layer 415 is activated. Activation of second photo-catalyst layer 415 weakens and/or breaks down the bond between the completed mold and the molded substrate to facilitate release of the completed mold without significant damage to the completed mold or to the molded substrate. The reaction between second photo-catalyst layer 415 and the molded substrate can be the same type of reaction as that between first photo-catalyst layer 410 and the residual layer, as described in detail above. After the mold illustrated in FIG. 4D is used to mold a substrate, second photo-catalyst layer 415 can again be activated with the appropriate radiation to help clean the mold.

One or more flow diagrams may have been used herein. The use of flow diagrams is not meant to be limiting with respect to the order of operations performed. The herein described subject matter sometimes illustrates different components contained within, or connected with, different other components. It is to be understood that such depicted architectures are merely illustrative, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A molding system, comprising:
   a base;
   a plurality of protuberances that extend from the base, wherein each protuberance has an end surface and side surfaces, and wherein a valley with a bottom is formed between each pair of the protuberances;
   a first photo-catalyst layer on the end surface and on the side surfaces of the protuberances and on bottoms of the valleys formed between pairs of protuberances, wherein the first photo-catalyst layer is configured to at least partially break down a residual layer on a substrate in response to activation of the first photo-catalyst layer by a first radiation at a first wavelength or range of wavelengths;
   a second photo-catalyst layer on top of portions of the first photo-catalyst layer at the side surfaces of the protuberances and at the bottoms of the valleys formed between the pairs of the protuberances, wherein the second photo-catalyst layer is absent from the end surfaces of the protuberances, wherein the second photo-catalyst layer is activated by a second radiation at a second wavelength or range of wavelengths to at least partially break down a resist layer on the substrate, and wherein the first wavelength or range of wavelengths is different than the second wavelength or range of wavelengths,
   wherein the activation of the first photo-catalyst layer by the first radiation causes a reaction between the first photo-catalyst layer and the residual layer on the substrate only at points of contact of the end surfaces of the protuberances with the residual layer, so as to at least partially break down the residual layer at the points of contact, and
   wherein the second photo-catalyst layer shields the portions of the first photo-catalyst layer, at the side surfaces of the protuberances and at the bottoms of the valleys between the pairs of protuberances, from reaction with the resist layer when the first photo-catalyst layer is activated by the first radiation source to cause the reaction between the first photo-catalyst layer and the residual layer at the points of contact of the end surfaces of the protuberances with the residual layer;
   a first stage configured to hold the molding system;
   a second stage configured to hold the substrate; and
   a radiation source mounted to the first stage and configured to apply the first radiation to the first photo-catalyst layer and the second radiation to the second photo-catalyst layer.

2. The molding system of claim 1, wherein the base and the plurality of protuberances are radiation transmissive.

3. The molding system of claim 1, wherein the first radiation has a wavelength of between approximately 10 nanometers (nm) and approximately 400 nm.

4. The molding system of claim 1, wherein the second photo-catalyst layer is configured to at least partially break a bond between the molding system and the substrate or the resist layer on the substrate.

5. The molding system of claim 1, wherein the first photo-catalyst layer comprises at least one of titanium oxide, silicon oxide, zinc oxide, ferric oxide, tungsten oxide, gallium phosphide, gallium arsenide, cadmium sulfide, or strontium titanate.

6. A nanoimprinting template, comprising:
a base;
a plurality of protuberances extending from the base, wherein each of the plurality of protuberances has an end surface and side surfaces, and wherein a valley with a bottom is formed between each pair of the plurality of protuberances;
a first photo-catalyst layer on the end surface and the side surfaces of each of the plurality of protuberances and on bottoms of the valleys formed between the protuberances, wherein the first photo-catalyst layer is configured to at least partially break down a residual layer on a substrate in response to activation of the first photo-catalyst layer by a first radiation at a first wavelength or range of wavelengths; and
a second photo-catalyst layer on a top of portions of the first photo-catalyst layer at the side surfaces of the plurality of protuberances and at the bottoms of the valleys between the pairs of protuberances, wherein the second photo-catalyst is absent from the end surfaces of the protuberances, wherein the second photo-catalyst layer is activated by a second radiation at a second wavelength or range of wavelengths, and wherein the first wavelength or range of wavelengths is different than the second wavelength or range of wavelengths.

7. The nanoimprinting template of claim 6, wherein the activation of the first photo-catalyst layer by the first radiation causes a reaction between the first photo-catalyst layer and the residual layer on the substrate only at points of contact of the end surfaces of the protuberances with the residual layer, so as to at least partially break down the residual layer at the points of contact, and
wherein the second photo-catalyst layer shields the portions of the first photo-catalyst layer, at the side surfaces of the protuberances and at the bottoms of the valleys between the pairs of protuberances, from reaction with the resist layer when the first photo-catalyst layer is activated by the first radiation source to cause the reaction between the first photo-catalyst layer and the residual layer at the points of contact of the end surfaces of the protuberances with the residual layer.

8. The nanoimprinting template of claim 6, wherein the nanoimprinting template comprises part of a molding system, the molding system including:
a first stage configured to hold the nanoimprinting template;
a second stage configured to hold the substrate; and
a radiation source mounted to the first stage and configured to apply the first radiation to the first photo-catalyst layer and the second radiation to the second photo-catalyst layer.

* * * * *

UNITED STATES PATENT AND TRADEMARK OFFICE
CERTIFICATE OF CORRECTION

| | | |
|---|---|---|
| PATENT NO. | : 9,046,762 B2 | Page 1 of 1 |
| APPLICATION NO. | : 12/708054 | |
| DATED | : June 2, 2015 | |
| INVENTOR(S) | : Kusuura | |

It is certified that error appears in the above-identified patent and that said Letters Patent is hereby corrected as shown below:

In the claims

Column 15, Line 22, Claim 6, delete "a top" and insert -- top --, therefor.

Signed and Sealed this
Tenth Day of November, 2015

Michelle K. Lee
*Director of the United States Patent and Trademark Office*